(12) United States Patent
Chang et al.

(10) Patent No.: US 8,092,737 B2
(45) Date of Patent: Jan. 10, 2012

(54) METHOD OF MICRO/NANO IMPRINTING

(75) Inventors: Jer-Haur Chang, Pusin Township, Changhua County (TW); Yuet-Ping Lee, Taipei (TW); Lon A. Wang, Taipei (TW); Yung-Pin Chen, Taipei (TW)

(73) Assignee: National Taiwan University (TW)

( * ) Notice: Subject to any disclaimer, the term of this patent is extended or adjusted under 35 U.S.C. 154(b) by 391 days.

(21) Appl. No.: 12/230,660

(22) Filed: Sep. 3, 2008

(65) Prior Publication Data

US 2009/0194913 A1 Aug. 6, 2009

(30) Foreign Application Priority Data

Jan. 31, 2008 (TW) .............................. 97103692 A (51) Int. Cl.
*B29C 33/58* (2006.01)
(52) U.S. Cl. .......... 264/316; 264/85; 264/293; 264/319; 264/322; 264/496
(58) Field of Classification Search .................. 264/293, 264/322, 496

See application file for complete search history.

(56) References Cited

U.S. PATENT DOCUMENTS

| 7,137,803 | B2 | 11/2006 | Chou |
| 7,195,734 | B2 | 3/2007 | Heidari |
| 2004/0040644 | A1* | 3/2004 | Chang et al. .................. 156/209 |
| 2006/0246169 | A1 | 11/2006 | Chen et al. |

OTHER PUBLICATIONS

Fang-Sung Cheng and Sen-Yeu Yang, Novel Hydrostatic Pressuring Mechanism for Soft UV-Imprinting Processes, Jan./Feb. 2008, J. Vac. Sci. Technology, B vol. 26 No. 1, pp. 132-136.*
Fang-Sung Cheng, Sen-Yeu Yang, Shih-Chih Nian, Lon A. Wang, Soft mold and gasbag pressure mechanism for patterning submicron patterns onto a large concave substrate, *J. Vac. Sci. Technol. B*, Jul./Aug. 2006, pp. 1724-1727, vol. 24, No. 4.

* cited by examiner

*Primary Examiner* — Yogendra Gupta
*Assistant Examiner* — Ninh Le
(74) *Attorney, Agent, or Firm* — Bacon & Thomas, PLLC (57) ABSTRACT

Disclosed is a method of micro/nano imprinting, which applies soft mold, pre-shaping sealing film, and soft holder arrangements to the micro/nano structure imprinting process of the curved substrates. The method of the present invention can prevent the curved surface from crumbling, which may result from high gas pressuring, and can obtain uniform imprinting pressure distribution throughout the whole curved substrate. Moreover, replicating micro/nano structures onto double-sided curve, both convex and concave, surfaces can also be achieved.

18 Claims, 15 Drawing Sheets

METHOD OF MICRO/NANO IMPRINTING

BACKGROUND OF THE INVENTION

1. Field of the Invention

The present invention relates to a method of micro/nano imprinting patterning on a non-planar substrate, and in particular, relates to a method which applies soft mold, pre-shaping sealing film, and soft holder arrangements, with the exploring of UV light, or heat treatment, to the micro/nano structure imprinting process of the curved substrates. The method of the present invention prevents the curved surface from crumbling, which may result from high gas pressure, and can obtain uniform imprinting pressure distribution throughout the whole curved substrate. Moreover, replicating micro/nano structures onto a double-sided non-planar surfaces, both convex and concave, can also be achieved.

2. Description of Related Art

Micro- and nano-fabrication have increasingly become more important due to the impending requirements of modern science and technology. The technologies, such as hot embossing, UV-embossing and injection molding etc., enable low-cost mass production of microstructures. As such, it is an appropriate technology for the production of both components and modules for micro optical devices. The general fabrication processes involve the fabrication of an original sub-micron structure relief, the formation of a suitable mold from this relief and the mass production of replicas in polymer (or other materials to be used) from this mold.

Patterning sub-micron structures onto non-planar substrates recently has drawn much interest, especially for the fabrication of dish solar concentrators, optical, and astronomical and bio-sensing components. There are several ways, such as optical lithography, e-beam lithography, ion-beam lithography, X-ray LIGA, laser direct writing and diamond turning, for patterning sub-micron structures down to the curved surfaces. However, most these methods are not applicable because of very short depth of focus, not to mention they are time consuming, complex and expensive.

Nanoimprint Lithography (NIL) is not limited to the resolution of optical diffraction, and has the advantages of low cost, high efficiency, and high resolution, thus is extensively applied to micro/nano patterning. The method of nanoimprint lithography utilizes a mother mold having a pre-determined pattern, and transfers the pre-determined pattern of the mother mold to the resist with a provided pressure. There are two kinds of operating procedures of nanoimprint lithography: thermo nanoimprint and UV cured nanoimprint. Thermo nanoimprint method applies heat treatment to the thermoplastic resist such as PMMA (poly-methylmethacrylate) or PS (poly-styrene) to a moldable state, then cooling to solidify the resist after being in close contact with the mother mold. Finally, the mother mold and the resist are separated to provide a sub-micron patterned structure. UV light exposure is used in the UV cured nanoimprint method to cure the photo-resist at a lower temperature, comparing with the high temperature of the thermo nanoimprint method. The nanoimprint method can reproduce very high-resolution sub-micron structure features. For example, it is relatively easy to replicate into polymer foil sub-micron structure with line width below 100 nm. Besides, although the fabrication of a mold with complex sub-micron structure can be relatively expensive, the replication process results in a commercially competitive process and low cost per replica.

Traditional Nanoimprint Lithography methods were easily performed such as the method described in U.S. Pat. No. 7,137,803, wherein a fluid pressure imprint lithography method is presented. The method uses direct fluid pressure to press a mold into a substrate supported film, in which the stack of the mold, the moldable layer, and the substrate was placed in a flexible, fluid-impermeable membrane (e.g. a plastic bag). In 2007, Heidari et al. proposed a method of nanoimprint, in which a base plate was used to transfer a substrate to a template for nanoimprint process (U.S. Pat. No. 7,195,734). Also, in 2006, Chen et al. (US patent No. 2006/0246169A1) disclosed a method using a uniform pressing unit having a flexible membrane and a fluid filled in a space formed by the flexible membrane, therefore the uniform pressing unit can directly apply pressure to the mold. However, in between these methods, only flat substrates can be applied into fabrication of nano structure objects, and no mention of curved nanoimprints was disclosed in these prior arts.

Alternatively, Cheng et al. disclosed a soft mold and gas-bag pressure (GBP) mechanism for patterning submicron patterns onto a large concave substrate, but the method still had some limitations in processing conditions (F. S. Cheng, S. Y. Yang, S. C. Nian and Lon A. Wang, "Soft mold and gasbag pressure mechanism for patterning submicron patterns onto a large curved substrate," Journal of Vacuum Science & Technology B: Microelectronics and Nanometer Structures, Volume 24, Issue 4, pp. 1724-1727(2006)). In this GBP method, a gasbag is expanded in the chamber and gradually contacts the imprinting patterns. Therefore, non-uniform pressure will occur because the gasbag is not in contact with the imprinting patterns at one time. Besides, the gasbag used in such mechanism has low heat resistance, so the method is always limited to UV light exposure. Since the gasbag used is usually opaque, a transparent substrate (e.g. glass, quartz) for light exposure from the bottom will be needed. Moreover, it is difficult to provide a huge gasbag if a large area imprinting process is performed. Hence, the gasbag pressure mechanism is difficult to apply to semiconductor fabrication because the silicon substrates used usually possess a large area.

Therefore, it is a present need to develop a novel method of micro/nano fabrication with low cost, large area production, and high efficiency, and particularly, to develop a method of providing a double-sided patterned curved structure.

SUMMARY OF THE INVENTION

The object of the present invention is to provide an effective method for fabricating sub-micron structures onto a non-planar substrate by combining thermoforming and nanoimprint technologies, called curved surface nanoimprint (CSN). CSN scheme can prevent the curved substrate from crumbling, which may result from high gas pressuring, and could obtain uniform imprinting pressure distribution throughout the whole curved substrate. Moreover, replicating sub-micron structures onto a double-sided non-planar surface, both convex and concave, can also be achieved.

The first mode of the present invention provides a method of micro/nano curved surface imprinting, which comprises: a chamber; forming a stack comprising a curved substrate, a pre-shaping sealing film having a shape corresponding to the shape of the curved substrate, a mold, and a moldable layer disposed on a surface of the substrate; applying a pressure to the stack when the moldable layer is heated to be in a mold-able state; wherein the method is characterized in that the chamber is separated into a first and a second space by the pre-shaping sealing film, the mold and the moldable layer are located in the second space, a high pressure fluid is applied from the first space to the stack when the moldable layer is heated to be in a moldable state, thus a pattern of the mold is imprinted onto the moldable layer. Therefore, the method of micro/nano curved surface imprinting of the present invention can prevent the curved substrate from crumbling, and can obtain uniform imprinting pressure distribution throughout the whole large area curved substrate.

The second mode of the present invention provides a method of micro/nano curved imprinting, which comprises: a chamber; forming a stack comprising a curved substrate, two moldable layers disposed on two opposite surfaces of the substrate, two molds, and a pre-shaping sealing film having a shape corresponding to the shape of the curved substrate; applying a pressure to the stack when the moldable layers are heated to be in a moldable state; wherein the method is characterized in that the chamber is separated into a first and a second space by the pre-shaping sealing film, the molds and the moldable layers are located in the second space, a high pressure fluid is applied from the first space to the stack when the moldable layers are heated to be in a moldable state, thus the patterns of the two molds are imprinted respectively onto the two moldable layers and a double-sided patterned curved structure is formed.

According to the present invention, the moldable layer is preferably heated by a heat radiator such as platform heater, infrared heater, high frequency induction heater, UV illuminator, and halogen lamp, but is not limited thereto. The fluid can be pre-heated before entering the chamber for maintaining the moldable layer at a moldable state, but is not limited thereto.

According to the present invention, the method of micro/nano curved surface imprinting may further comprise a light illuminating process in order to cure the moldable layer.

According to the present invention, the curved substrate is not limited but preferably is made of a material selected from: ultra thin wafer, glass, ceramics, plastics, and metal.

According to the present invention, the moldable layer is not limited but preferably is made of resin, photoresist, gel, or superplastic metallic material.

According to the present invention, the pre-shaping sealing film is not limited but preferably is a plastic film, resin film, or metal foil.

According to the present invention, the high pressure fluid is not limited but preferably is one selected from the group consisting of: nitrogen, carbon dioxide, inert gas, steam, water, oil, air, and the mixtures thereof.

Other objects, advantages, and novel features of the invention will become more apparent from the following detailed description when taken in conjunction with the accompanying drawings.

DETAILED DESCRIPTION OF THE PREFERRED EMBODIMENT

The invention may now be better understood by consideration of the following specific examples.

Example 1

Figure 1A:
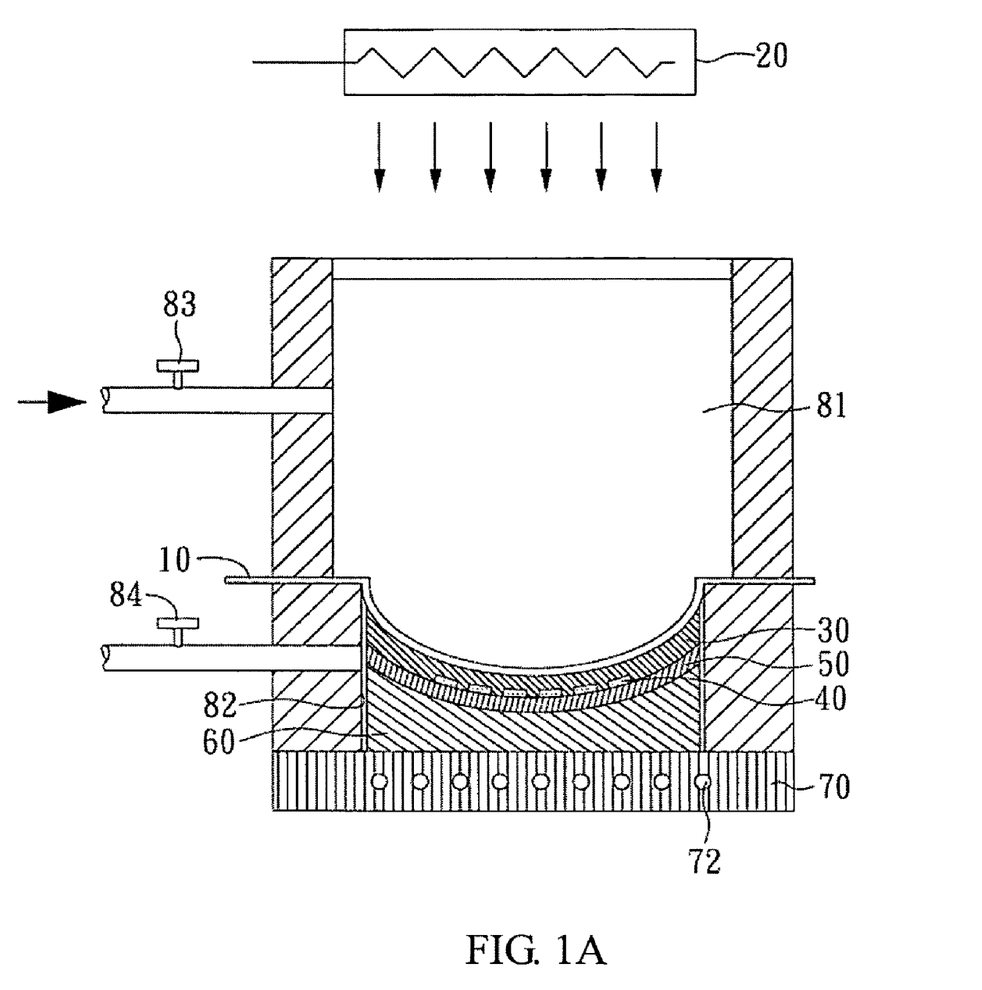
FIG. 1A is a schematic view of a device used for micro/nano imprinting of Example 1.

With reference to FIG. 1A, a schematic view of a device used for micro/nano imprinting of the present example is shown. By employing Rowland circle geometry, a concave reflective grating spectrometer is provided.

Figure 1B:
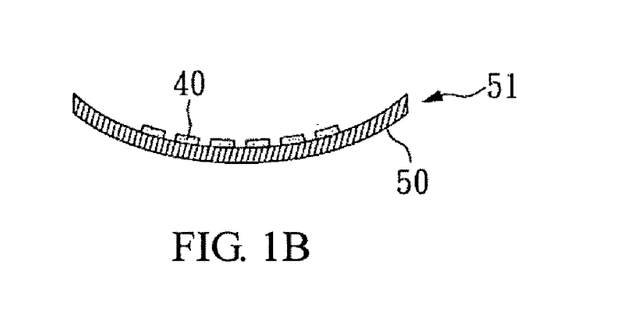
FIG. 1B is a schematic view of a curved grating provided by Example 1.

The apparatus of fabricating the curved grating of the present invention is shown in FIG. 1. The PDMS (polydimethyl siloxane) mold 30 was placed above a curved glass substrate 50 coated with photoresist (SU-8 2010 from MicroChem Co.) 40 as shown in FIG. 1. The radius of curvatures of the glass substrate 50 was 92.5 mm. Then a pre-shaping sealing film 10 was placed above them. After closing and vacuuming the chamber, nitrogen fills the chamber 81 to press the stack. The bottom soft holder 60 can prevent the glass substrate 50 from being broken due to excessive pressure of gas. Then the photo-resist layer 40 was cured by UV light exposure from the UV light source 20 and heat treatment from the heater 70. Finally, nitrogen and vacuum were released, and then the pre-shaping sealing film 10 and the PDMS mold 30 were removed to obtain the curved grating 51 (as shown in FIG. 1B).

The method of forming the pre-shaping sealing film 10 in the present example is presented below:

Preparation of Pre-Shaping Sealing Film

Thermoforming is a manufacturing process for thermoplastic sheet or film. There are several categories of thermoforming, including vacuum forming, pressure forming, twin-sheet forming, drape forming, free blowing, simple sheet bending, and matched-mold forming.

Figure 2:
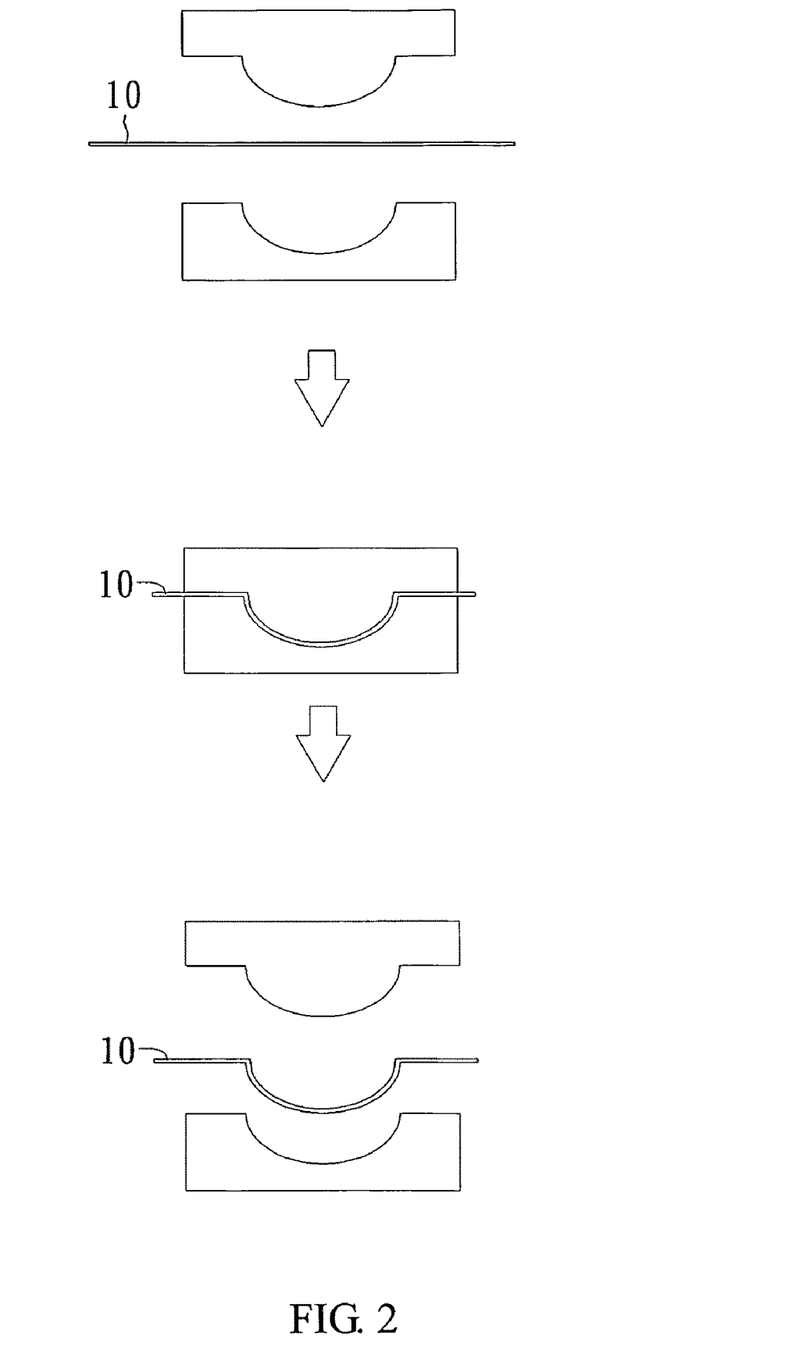
FIG. 2 is a schematic flow diagram of the steps in a method of providing the pre-shaping sealing film of Example 1.

The matched-mold forming process is a heated sheet to be placed between two matching male/female heated molds, which are then pressed to each other. FIG. 2 shows the thermoforming process sequence of pre-shaping of plastic film for curved NIL (nanoimprint lithography). The pre-shaping of sealing film 10 is prepared for matching the surface's contours of the curved glass substrate 50.

During the nanoimprinting process, it is easy to perform excellent pressure uniformity when a pre-shaping sealing film 10 is used, and accordingly, a curved grating having good optical characteristic is thus produced.

Besides excellent pressure uniformity, large area manufacture without the disadvantage of the curved substrates being crumbled is also available using pre-shaping sealing film, which cannot be obtained by the traditional nanoimprint lithography having no pre-shaping sealing film. Therefore, pre-shaping of sealing film becomes the key component of curved surface nanoimprint lithography.

Test Example

Pressure Uniformity Test

Pressure uniformity over a curved imprint field was investigated with pressure-sensitive films. The pressure sensitive film (Fuji Prescale Film, Japan) can indicate pressures by colors from 5 to 3000 kgf/cm$^2$.

Figure 3A:
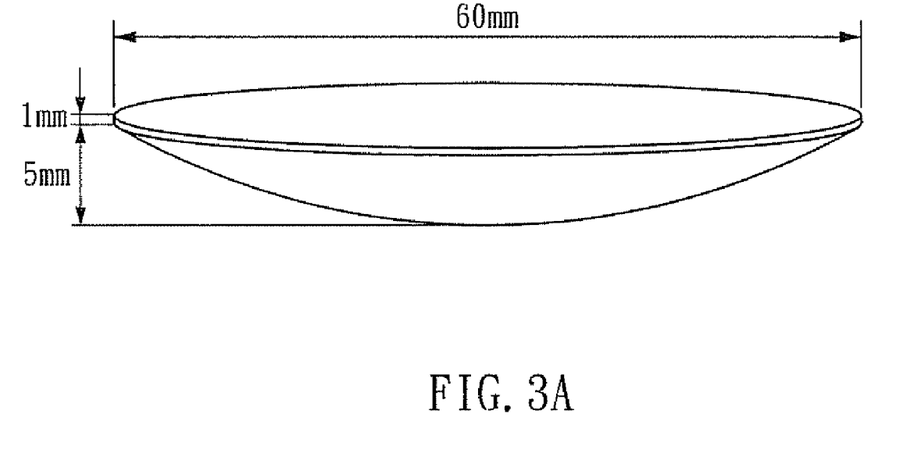
FIG. 3A shows a curved substrate of the experimental group of the test example.
Figure 3B:
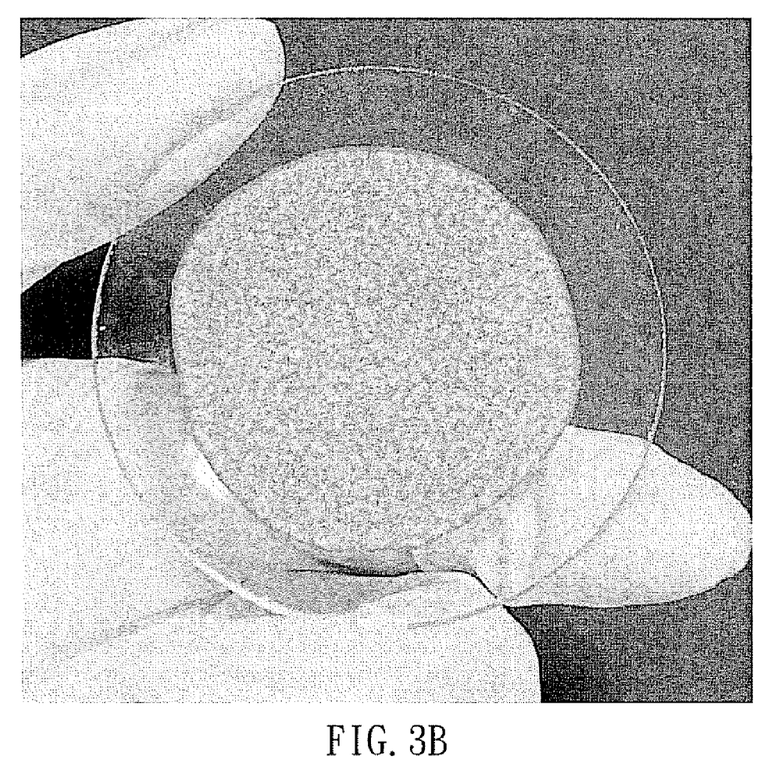
FIGS. 3B-3C are test results of the experimental group of the test example.
Figure 3C:
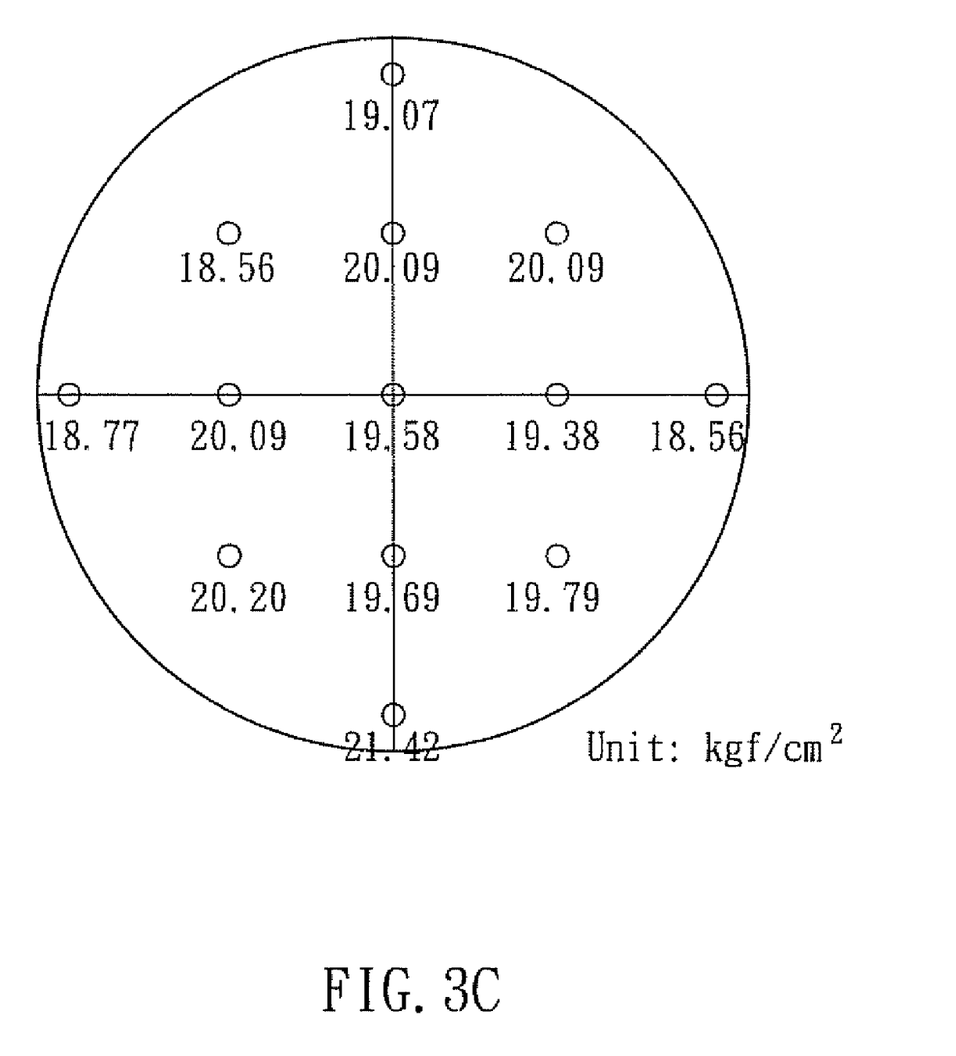
Figure 3D:
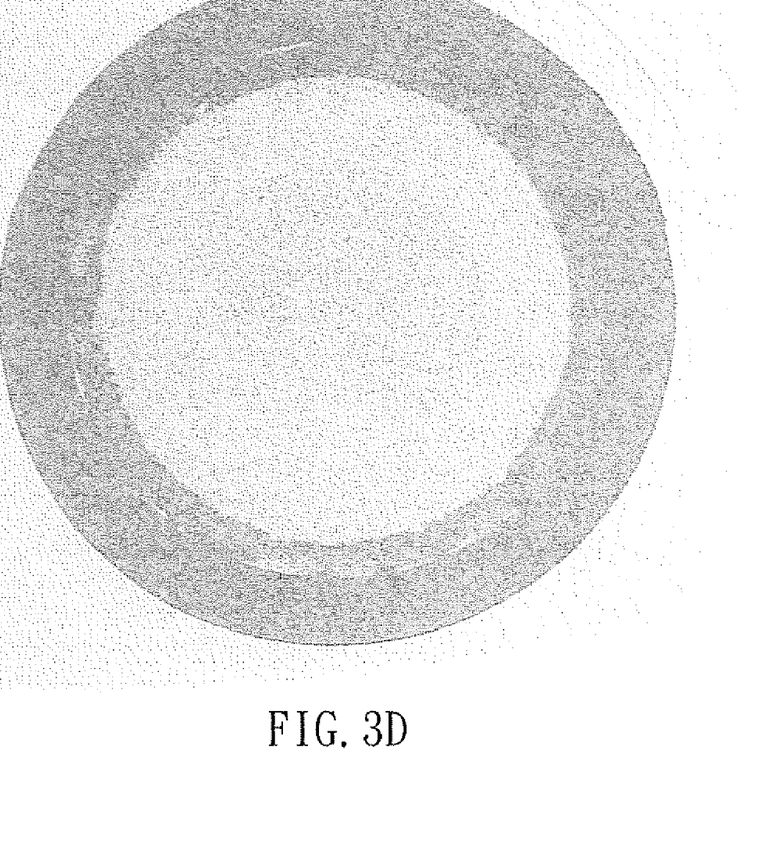
FIGS. 3D-3E are test results of the control group of the test example.
Figure 3E:
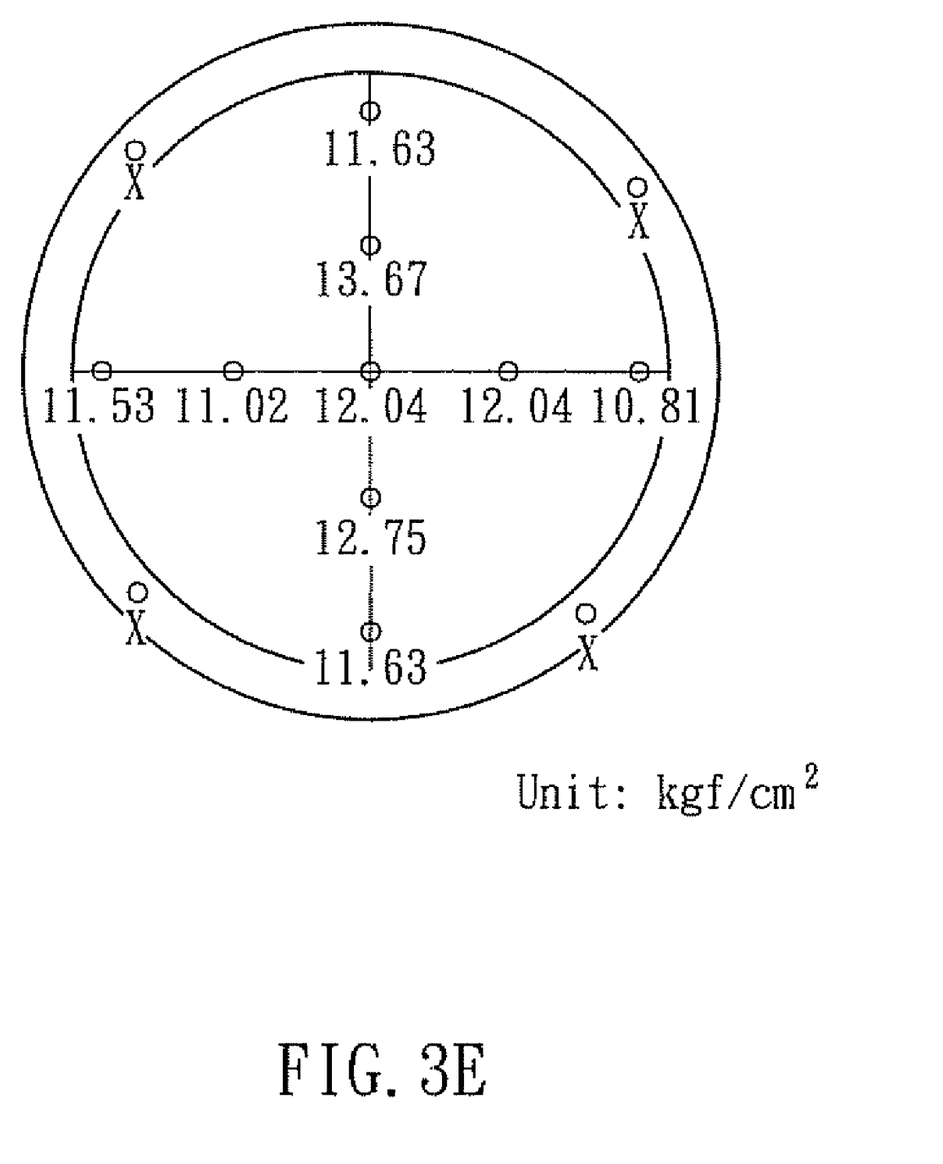

To investigate the pressure distribution over a curved imprint field, a pressure-sensitive film (LLW type) was placed between a pre-shaping sealing film and a curved substrate as an experimental group (as shown in FIG. 3A). Also, a control group is prepared without the use of a pre-shaping sealing film. The concave substrate used is of 62 mm in diameter and has 92.5 mm radius of curvature as shown in FIG. 3A. Color density of the pressed film is measured by a densitometer detector (FPD305E/306E) and the resulting color density uniformity over the entire curved nanoimprint field under the gas pressure of 20 kgf/cm$^2$ is shown in FIGS. 3B and 3C. The values of the mean and the standard deviation from the experimental group over the imprint area were 19.6 and 1.60 kgf/cm$^2$, respectively. In contrast, a non-uniform pressure distribution was observed without pre-shaping sealing film (the control group) as shown in FIGS. 3D and 3E. This shows that the pre-shaping sealing film provides excellent contact and uniform pressing pressure throughout the whole curved area.

Figure 4A:
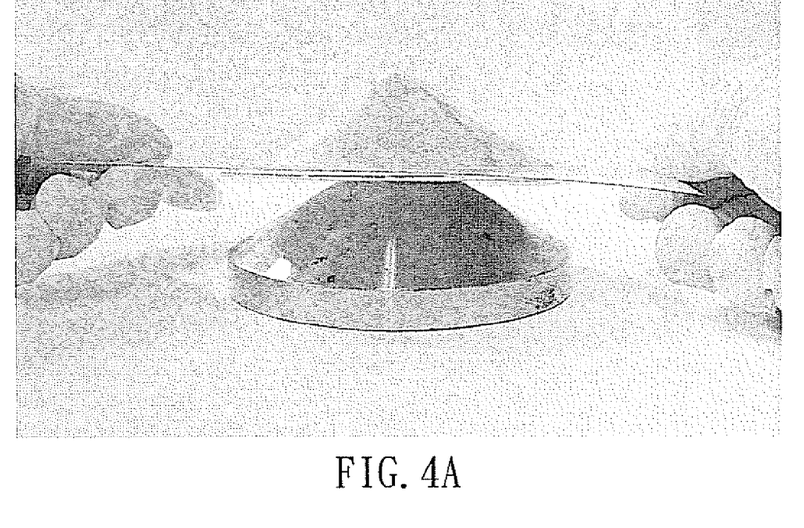
FIG. 4A is a photograph when applying conoid pressure uniformity test.
Figure 4B:
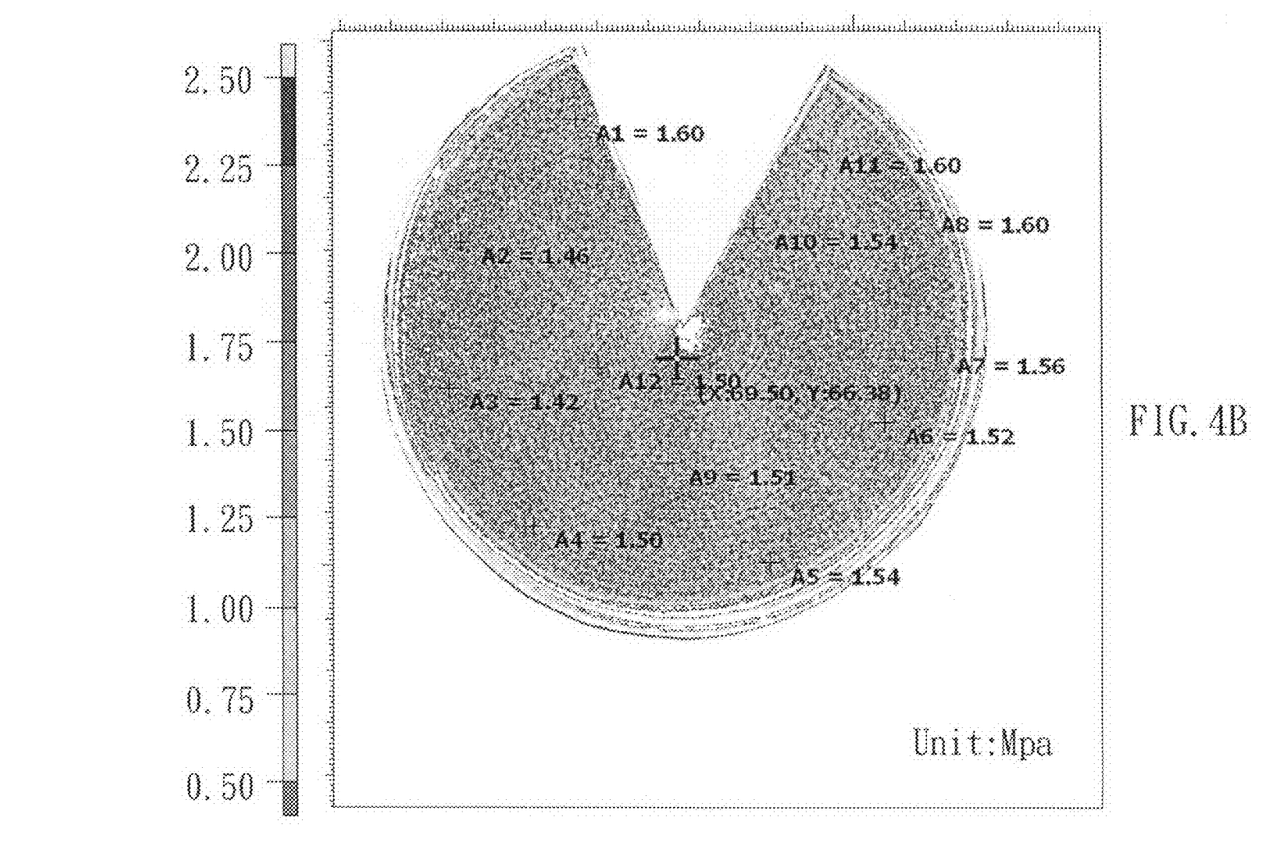
FIG. 4B shows a result of the conoid pressure uniformity test.

For another pressure uniformity test, a 4-inch high curvature conoid with 100 mm in diameter and 30 mm in height serves as a test substrate. A pressure-sensitive film is provided on the curvature conoid, covering with a pre-shaping sealing film, and the uniform color density over the entire curvature conoid under the gas pressure of 15 kgf/cm$^2$ is measured, and the result is shown in FIG. 4B. The values of the mean and the standard deviation over the imprint area are 15.7 and 1.16 kgf/cm$^2$, respectively. Also, it can be seen that excellent pressure uniformity over the high curvature conoid is represented in FIG. 4B.

SEM (Scanning Electron Microscope) Photograph

Figure 5:
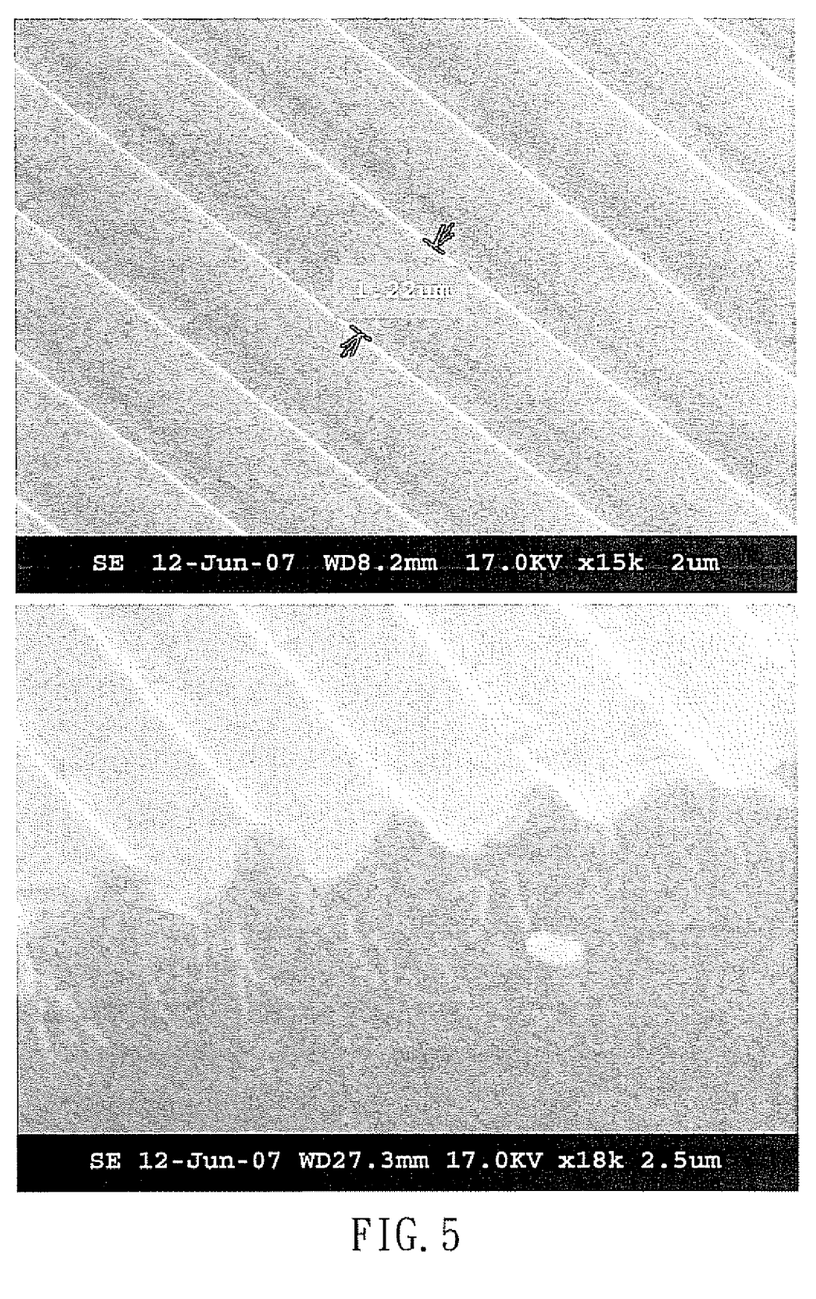
FIG. 5 is an SEM photo of the curved grating structure according to Example 1 of the present invention.

The grating period of the silicon mold as a mother mold is 1.2 μm in the present invention. As the SEM photograph shown in FIG. 5, the grating period of the concave grating provided is 1.2 μm, representing that the dimensions of the replicated patterns on the concave grating were very close to those in the original silicon mold. As can also be seen from the SEM photograph shown in FIG. 5, the shape is kept complete, which means a good optical characteristic will be achieved.

Example 2

Figure 6A:
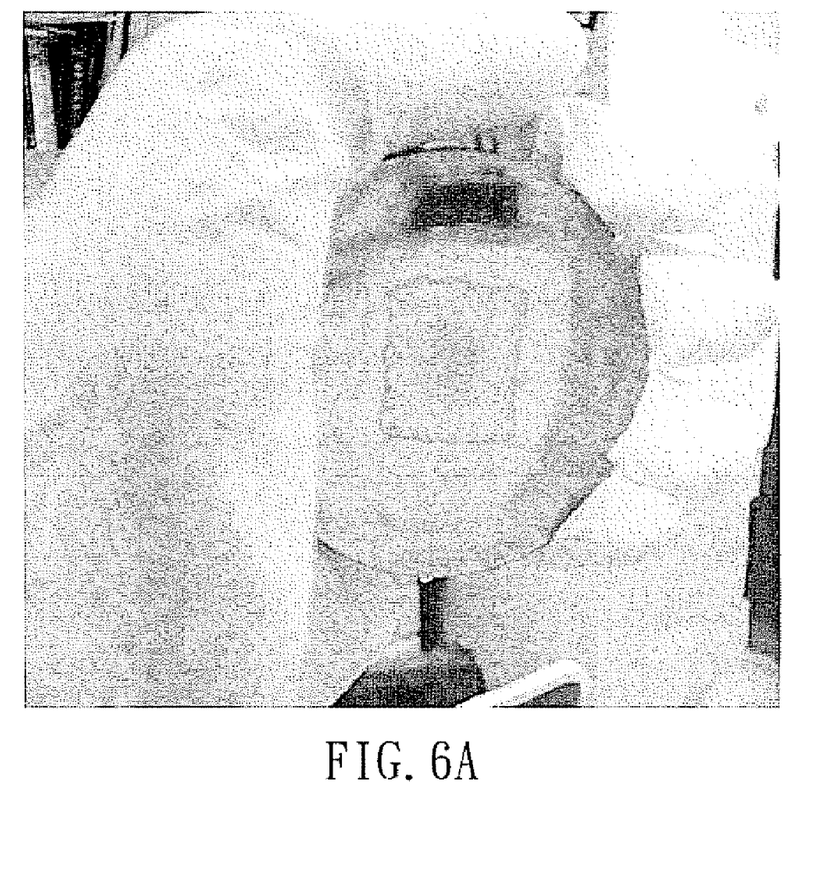
FIG. 6A is a photograph of the curved structure according to Example 2 of the present invention.
Figure 6B:
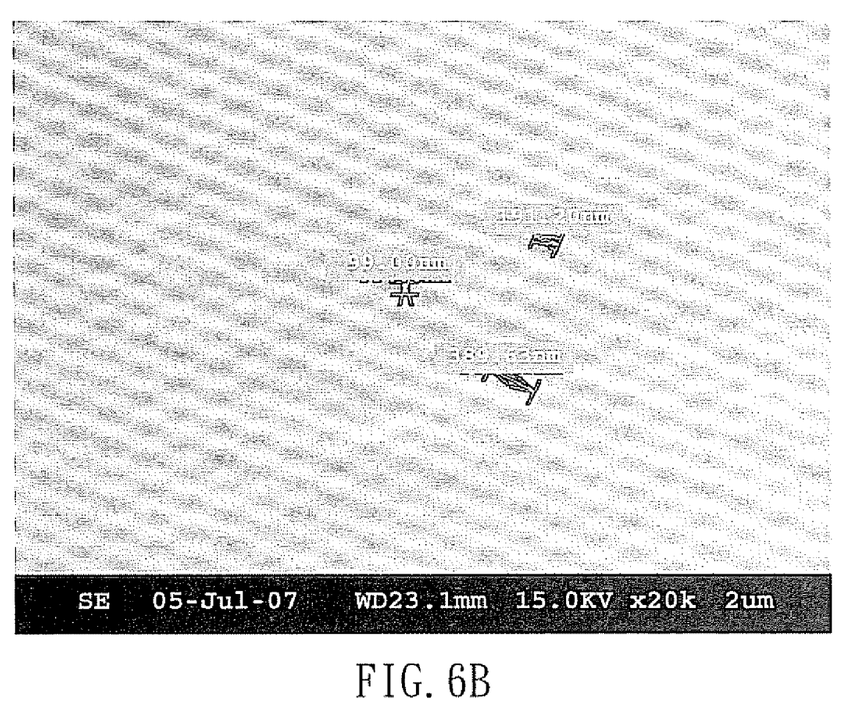
FIG. 6B is an SEM photo of the curved structure according to Example 2 of the present invention.

With reference to FIG. 6A, there is shown a photograph of the curved structure according to the present example, wherein the method used to provide the curved structure is the same as the method of Example 1, except that the PDMS mold having different patterns is applied. An antireflection sub-wavelength structure is thus formed in the present example, which may further be applied to the Dish Solar Energy Board. An SEM photo of 2-Dimensional anti-reflective structure of the present example is as shown in FIG. 6B.

Example 3

Figure 7:
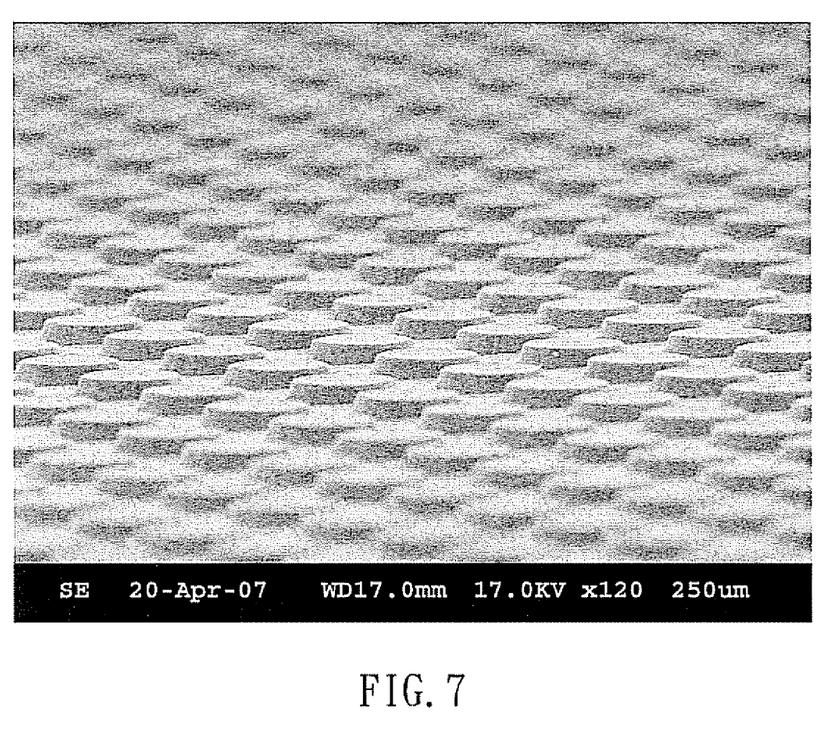
FIG. 7 is an SEM photo of the curved structure according to Example 3 of the present invention.

With reference to FIG. 7, an SEM photo of the curved structure according to the present example is shown. The method of providing the curved structure is the same as the method used in Example 1, except that the PDMS mold having different patterns is applied. A micro-rod structure is thus formed in the present example, which may further be applied to the bionic compound eyes imaging system or the curved screen with micro/nano features for 3D display system.

Example 4

Figure 8A:
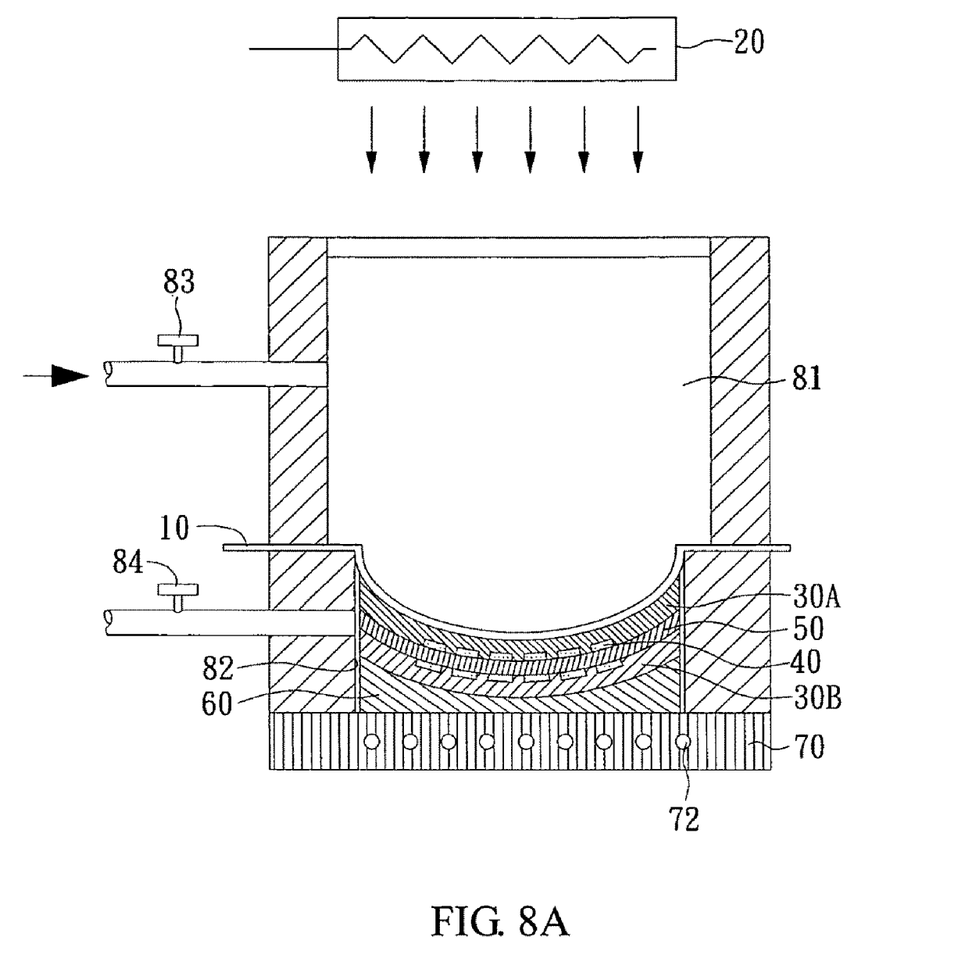
FIG. 8A is a schematic view of a device used for micro/nano imprinting of Example 4.

Referring to FIG. 8A, a device used for micro/nano imprinting is shown. An object of the present Example is to provide a double-sided grating, which can be applied to a photo-lithography process, light communication, or polarized beam splitter. Moreover, double-sided curve patterns can further be applied to reflective cups for Light-Emitting Diode (LED) or Cold Cathode Fluorescent Lamp (CCFL) illumining display devices.

Figure 8B:
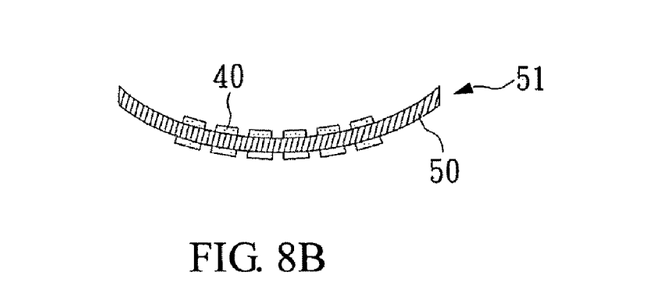
FIG. 8B is a schematic view of a double-sided grating provided by Example 4.
Figure 9A:
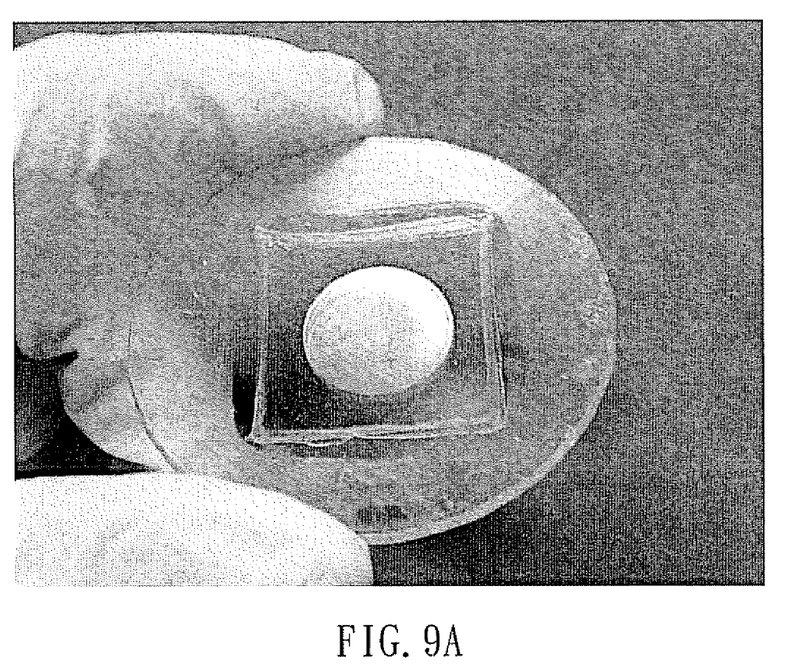
FIG. 9A is a photograph taken from the concave side of the double-sided curved grating 50 according to Example 4 of the present invention.
Figure 9B:
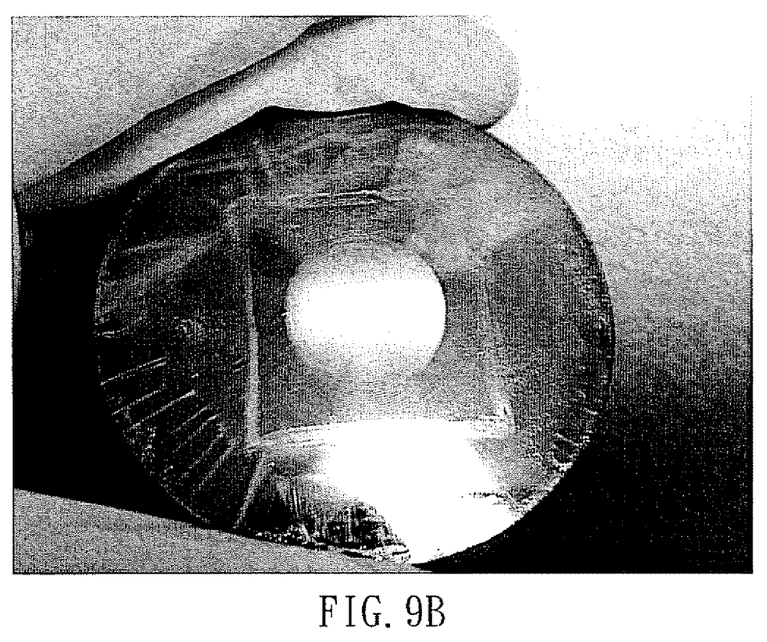
FIG. 9B is a photograph taken from the convex side of the double-sided grating 50 according to Example 4 of the present invention.

First, a curved glass substrate 50 is provided, two photo-resist layers 40 (SU-8 2010, commercially available from MicroChem) are applied on the two opposite surfaces of the curved glass substrate 50. Two PDMS (polydimethyl siloxane) molds 30A, 30B cover on the two photo-resist layers 40 respectively, then covered with a pre-shaping sealing film 10, which has a shape corresponding to the shape of the curved glass substrate 50, to form a stack. The gas is exhausted from the chamber 82 via the valve 84 to provide a vacuum atmosphere, and nitrogen then fills in from the valve 83 into chamber 81 to perform a gaseous pressure. The soft holder 60 locating at the bottom side of the chamber 82 prevents the curved glass substrate 50 cracking caused by the excessive gaseous pressure. The bottom soft holder 60 can prevent the curved glass 50 being broken because of excessive gas pressure. Then the photo-resist layer 40 was cured by UV light exposure from the UV light source 20 and heat treatment from the heater 70. Finally, after cooling by the cooling apparatus 72, nitrogen and vacuum are released, and the pre-shaping sealing film 10, two PDMS molds 30A, 30B are removed to obtain the double-sided curved grating 51 (as shown in FIGS. 8B, 9A, and 9B). Herein, FIGS. 9A and 9B represent the photographs of the concave side and the convex side of the double-sided curved grating 51 according to the present example, respectively.

Although the present invention has been explained in relation to its preferred embodiment, it is to be understood that many other possible modifications and variations can be made without departing from the scope of the invention as hereinafter claimed.

What is claimed is:

1. A method of micro/nano curved surface imprinting, comprising:
   providing a heated sheet and placing the heated sheet between two matching male/female heated molds;
   pressing the two matching male/female heating molds and the heated sheet placed in-between to shape the heated sheet;
   removing the two matching male/female heated molds and obtaining a pre-shaping sealing film
   providing a stack comprising a curved substrate, the pre-shaping sealing film having a shape corresponding to the shape of the curved substrate, a first mold, and a first moldable layer disposed on a surface of the substrate in a chamber, wherein the chamber is separated into a first and a second space by the pre-shaping sealing film, the first mold and the first moldable layer are located in the second space;

applying a high pressure fluid from the first space to the stack when the first moldable layer is heated to be in a moldable state; and forming a first moldable layer wherein a pattern on the mold is imprinted onto the first moldable layer with a uniform imprinting pressure distribution throughout the whole curved substrate and a patterned curved substrate is formed.

2. The method as claimed in claim 1, further comprising a second moldable layer and a second mold, wherein the chamber has a stack comprising a curved substrate, first and second moldable layers disposed on two opposite surfaces of the substrate, first and second molds, and a pre-shaping sealing film having a shape corresponding to the shape of the curved substrate;

wherein the pressure is applied to the stack when the first and second moldable layers are heated to be in a moldable state; and wherein the chamber is separated into a first and a second space by the pre-shaping sealing film, the first and second molds and the first and second moldable layers are located in the second space, a high pressure fluid is applied from the first space to the stack when the first and second moldable layers are heated to be in a moldable state, thus the patterns of the first and second molds are imprinted respectively onto the first and second moldable layers with a uniform imprinting pressure distribution throughout the whole curved substrate and a double-sided patterned curved structure is formed.

3. The method as claimed in claim 1, wherein the patterned curved structure is a micron or sub-micron structure.

4. The method as claimed in claim 2, wherein the patterned curved structure is a micron or sub-micron structure.

5. The method as claimed in claim 1, wherein the first moldable layer is heated by a heat radiator.

6. The method as claimed in claim 1, further comprising a light illuminating process to cure the moldable layer.

7. The method as claimed in claim 1, wherein the curved substrate is made of a material selected from: ultra thin wafer, glass, ceramics, plastics, and metal.

8. The method as claimed in claim 1, wherein the first moldable layer is made of resin, photoresist, gel, or superplastic metallic material.

9. The method as claimed in claim 1, wherein the pre-shaping sealing film is a plastic film, resin film, or metal foil.

10. The method as claimed in claim 1, wherein the high pressure fluid is one selected from the group consisting of: nitrogen, carbon dioxide, inert gas, steam, water, oil, air, and the mixtures thereof.

11. The method as claimed in claim 2, wherein the first moldable layers are heated by a heat radiator.

12. The method as claimed in claim 2, further comprising a light illuminating process to cure the moldable layer.

13. The method as claimed in claim 2, wherein the curved substrate is made of a material selected from: ultra thin wafer, glass, ceramics, plastics, and metal.

14. The method as claimed in claim 2, wherein the first and second moldable layer is made of resin, photoresist, gel, or superplastic metallic material.

15. The method as claimed in claim 2, wherein the pre-shaping sealing film is a plastic film, resin film, or metal foil.

16. The method as claimed in claim 2, wherein the high pressure fluid is one selected from the group consisting of: nitrogen, carbon dioxide, inert gas, steam, water, oil, air, and the mixtures thereof.

17. The method according to claim 1, wherein the curved substrate is coated with photoresist.

18. The method according to claim 2, wherein the curved substrate is coated with photoresist.

\* \* \* \* \*